United States Patent [19]

Takezoe et al.

[11] Patent Number: 5,529,882
[45] Date of Patent: Jun. 25, 1996

[54] POSITIVE TYPE PHOTOSENSITIVE ANIONIC ELECTROCATING COMPOSITION

[75] Inventors: Koji Takezoe; Noboru Nakai; Kenji Seko, all of Kanagawa-ken, Japan

[73] Assignee: Kansai Paint Co., Ltd., Hyogo-ken, Japan

[21] Appl. No.: 422,917

[22] Filed: Apr. 17, 1995

[30] Foreign Application Priority Data

Apr. 15, 1994 [JP] Japan .................................. 6-101479

[51] Int. Cl.⁶ ...................................................... G03F 7/023
[52] U.S. Cl. ........................ 430/192; 430/165; 430/191; 430/193; 430/910
[58] Field of Search ....................... 430/190, 165, 430/192, 910, 270, 191, 193

[56] References Cited

U.S. PATENT DOCUMENTS

| | | | |
|---|---|---|---|
| 4,673,458 | 6/1987 | Ishikawa et al. | 156/659.1 |
| 4,885,229 | 11/1989 | Takenaka et al. | 430/285 |
| 4,975,351 | 12/1990 | Akaki et al. | 430/190 |
| 5,055,374 | 10/1991 | Seio et al. | 430/190 |
| 5,134,054 | 7/1992 | Isasawa et al. | 430/192 |
| 5,362,597 | 11/1994 | Sano et al. | 430/191 |

FOREIGN PATENT DOCUMENTS

| | | |
|---|---|---|
| 61-206293 | 9/1961 | Japan . |
| 1-121375 | 5/1989 | Japan . |
| 2-42446 | 2/1990 | Japan . |
| 2-289660 | 11/1990 | Japan . |
| 3-100073 | 4/1991 | Japan . |
| 3-100074 | 4/1991 | Japan . |

*Primary Examiner*—John S. Y. Chu
*Attorney, Agent, or Firm*—Wenderoth, Lind & Ponack

[57] ABSTRACT

The present invention provides a positive type photosensitive anionic electrocoating composition having excellent running stability and highly reliable image formability, and a process for pattern formation using said composition. Said composition comprises, as essential components, a resin (A) containing polyethylene glycol or polypropylene glycol chains each having a substituted or unsubstituted phenyl group at the end and a compound (B) containing at least one quinone diazide sulfone unit, and contains carboxyl groups in an amount of 0.2–3 moles per kg (solid content) of the composition.

26 Claims, No Drawings

POSITIVE TYPE PHOTOSENSITIVE ANIONIC ELECTROCATING COMPOSITION

BACKGROUND OF THE INVENTION

1. Field of the Invention

The present invention relates to a positive type photosensitive electrocoating composition having excellent running stability and highly reliable image formability, as well as to a process for pattern formation using the composition. More particularly, the present invention relates to a positive type photosensitive electrocoating composition suitable as an etching resist used in production of printed wiring board, as well as to a process for formation of electro-conductive pattern using the composition.

2. Description of the Prior Art

Printed wiring boards used in electronic apparatuses, etc. are produced mainly by a pattern printing process which comprises applying screen printing onto an insulating substrate having an electroconductive layer on the surface, or by a subtractive process which comprises forming a circuit pattern by photolithography using a photosensitive dry film.

Recently, as printed wiring boards have come to possess a higher density and higher accuracy, a finer circuit pattern and a smaller throughhole diameter have become necessary for such printed wiring boards. To satisfy such a need, there were proposed production processes using positive type photosensitive electrocoating resists.

As the positive type photosensitive electrocoating resist, there were proposed various water-soluble or water-dispersible compositions. Examples thereof are a composition composed mainly of a resin obtained by bonding o-quinone diazide sulfonic acid to a base resin (e.g. an acrylic resin having an ion-forming group) via a sulfonic acid ester linkage [U.S. Pat. No. 4,673,458 and corresponding Japanese Patent Application Kokai (Laid-Open) No. 206293/1986]; a composition composed mainly of a resin obtained by bonding hydroxylamine and o-quinone diazide sulfonic acid to a base resin (e.g. an acrylic resin having an ion-forming group) via a urethane linkage and a sulfonimide linkage [U.S. Pat. No. 4,975,351 and corresponding Japanese Patent Application Kokai (Laid-Open) No. 121375/1989]; a composition composed mainly of a mixture of (1) an acrylic resin obtained by copolymerization using, as one component, a polymerizable monomer having a relatively long side chain having an acid group (e.g. a carboxyl group) at the end and (2) a photosensitizer obtained by reacting an epoxy compound, an aromatic or heterocyclic carboxylic acid having a phenolic hydroxyl group, and a quinone diazide sulfonic acid halide [U.S. Pat. No. 5,055,374 and corresponding Japanese Patent Application Kokai (Laid-Open) No. 42446/1990]; a composition which is a mixture of (1) a compound or resin obtained by bonding hydroxylamine and o-quinone diazide sulfonic acid to a hydroxyl group-containing compound or resin via a urethane linkage and a sulfonimide linkage and (2) a base resin (e.g. an acrylic resin having an ion-forming group) [U.S. Pat. No. 5,134,054 and corresponding Japanese Patent Application Kokai (Laid-Open) No. 289660/1990]; a composition composed mainly of a photosensitive resin having a phenolic hydroxyl group and a carboxyl group or an amino group in the molecule, into which resin a quinone diazide sulfonic acid is introduced via a sulfonic acid ester linkage [U.S. Pat. No. 4,673,458, and corresponding Japanese Patent Application Kokai (Laid-Open) No. 206293/1986]; a composition comprising a mixture of a carboxyl group-containing polymer and a phenolic hydroxyl group-containing polymer, into which an o-quinone diazide sulfonic acid is introduced via a sulfonic acid ester linkage [Japanese Patent Application Kokai (Laid-Open) No. 100073/1991]; and a composition composed mainly of a mixture of a carboxyl group-containing acrylic resin and a sulfonic acid ester between a phenolic hydroxyl group-containing aromatic carboxylic acid ester and quinone diazide sulfonic acid [Japanese Patent Application Kokai (Laid-Open) No. 100074/1991].

The above conventional compositions, however, have various problems as mentioned below, and solutions thereto are needed.

For example, in the resin having a photosensitive group introduced via a sulfonic acid ester group, it is necessary to react the hydroxyl group (e. g. phenolic hydroxyl group) of a resin, with a sulfonic acid halide by dehydrohalogenation to form a sulfonic acid ester and thereby introduce an o-quinone diazide group. This reaction, however, is a polymer reaction and has various problems such as difficulty of quantitative introduction of said photosensitive group, difficulty of removal of halogen acid salt (by-product) and consequent difficulty of purification, long time required for production, low product yield and the like. Thus, the reaction is not suitable for industrial application.

In the process for introducing a photosensitive group, proposed in order to avoid a polymer reaction giving a by-product, which comprises reacting an o-naphthoquinone diazide sulfonic acid halide with a hydroxylamine derivative to bond them via a sulfonamide linkage, reacting the product with a diisocyanate (e.g. toluene diisocyanate) to form an intermediate having an isocyanate residue and a photosensitive group, and reacting the intermediate with a hydroxyl group-containing resin, there are advantages such as high yield in polymer reaction, no need of purification step, and the like; however, the steps up to formation of intermediate are complicated and take a long time, which poses the same problems as mentioned above.

In the resin obtained by introducing a photosensitive group into the hydroxyl group of a hydroxyl group-containing resin, the photosensitive group is randomly arranged on the resin; there fore, when the resin is made into an aqueous dispersion, the portion of the resin containing the photosensitive group of high hydrophobicity tends to be present on the surface of each resin particle of the aqueous dispersion. As a result, the aqueous dispersion is unstable and tends to cause deposition; and the azide group contacts easily with a basic compound (e.g. an amine) present in a large amount in the continuous phase of the aqueous dispersion, which easily invites the decomposition of the azide group and gives reduction in photosensitivity. This is a big drawback for an electrocoating resist which is required to have aqueous dispersion stability over a long term.

In the resin having a photosensitive group introduced via a sulfonic acid ester group, the sulfonic acid ester group is hydrolyzed easily, inviting further reduction in storage stability of electrocoating resist as well as in running stability of electrocoating bath.

In the process which comprises introducing a photosensitive group via a sulfonic acid imide linkage and a urethane linkage, the problem associated with hydrolysis is improved significantly, but there are problems such as (1) the dissolution of the irradiated portion of film in developer is slow, (2) development must be conducted at high temperatures and (3) the conditions allowing for development have a slightly narrow range.

As one measure for solving these problems, there were proposed electrocoating resists which are each an aqueous dispersion of a composition comprising a water-soluble or water-dispersible resin and an o-quinone diazide type photosensitizer; and a composition comprising an alkali-soluble resin (e.g. a phenolic resin) and an o-naphthoquinone diazide sulfonic acid ester of a polyhydroxybenzophenone is already in wide use as a resist for LSI production. In using this composition as an electrocoating resist for production of printed wiring board, the phenolic resin is not desirable in view of the dispersibility in water and the properties of the film obtained; therefore, a composition was proposed which uses an acrylic resin or the like as a water-soluble or water-dispersible resin. In these compositions, however, when they are made into aqueous dispersions, part of the quinone diazide type photosensitizer is present on the surfaces of the resin particles of the aqueous dispersion and the contact of the azide group with a basic compound gives rise to the deposition of the azide group, inviting reduction in photosensitivity.

Further, when a photosensitizer of sulfonic acid ester type is used, the sulfonic acid ester undergoes hydrolysis and the stability of the aqueous dispersion prepared is deteriorated, making it difficult to obtain an electrocoating resist bath having excellent running stability over a long term.

In order to improve the stability of an aqueous dispersion, it was proposed as mentioned above to use a comb-shaped acrylic resin obtained by copolymerization of a particular monomer of relatively long chain polyester or polyether having an acid group at one end and a polymerizable unsaturated group at the other end (in this resin, the ion-forming group is distant from the resin skeleton which is hydrophobic) and thereby allow a highly hydrophobic quinone diazide type photosensitizer to be easily present inside the resin particles dispersed in water. By this approach, there can be obtained an aqueous dispersion having considerably improved storage stability, but its running stability over a long term is not sufficient. Further in order to obtain said acrylic resin, a special monomer as mentioned above must be used and the process for production thereof has more and complicated steps and requires a long time. Furthermore, said monomer has a relatively large molecular weight and low copolymerizability with ordinary acrylic ester type monomers, etc., and tends to remain unreacted in produced resin or form a homopolymer.

The unreacted monomer and homopolymer tend to act as water-soluble components when present in an aqueous dispersion of composition and enables the formation of an aqueous dispersion of relatively good storage stability. This aqueous dispersion, however, has problems as an electrocoating resist because, when it is used in electrocoating and there is conducted circulation of electrocoating solution by pump (this circulation is requisite in electrocoating), the dispersed resin particles tend to cause fusion with each other and generate an agglomerate in the solution, which easily causes (1) deposition of said agglomerate on formed resist film and (2) plugging of filter used in circulation system. Further, since the composition of the above proposal uses a photosensitizer obtained by reacting an epoxy compound, an aromatic or heterocyclic carboxylic acid having a phenolic hydroxyl group and an o-quinone diazide sulfonic acid halide, many steps are needed in production of said photosensitizer, which is not favorable in industrial application.

Also in an electrocoating resist which is an aqueous dispersion of a mixture comprising a carboxyl group-containing polymer and a photosensitizer obtained by a quinone diazide type photosensitive group to a phenolic hydroxyl group-containing polymer (e.g. a polyvinylphenol) via a sulfonic acid ester linkage, the running stability is insufficient similarly to the above-mentioned case. Moreover, the photosensitizer used therein is obtained by a polymer reaction and therefore has the same production problems as mentioned above.

SUMMARY OF THE INVENTION

The present inventors made a study in order to solve the above-mentioned problems associated with conventional positive type photosensitive electrocoating compositions. As a result, the present inventors found out that in a positive type photosensitive electrocoating composition comprising a water-soluble or water-dispersible resin having a particular structure and a quinone diazide type photosensitizer, said photosensitizer has improved in-emulsion dispersibility without being modified, that the electrocoating bath of said composition has excellent storage stability and excellent circulation stability and, even at low turnover speeds, high running stability, that the electrocoating film formed with said composition gives a high contrast between the irradiated and removed (by development) portion and the unirradiated portion and has excellent etching resistance, and that said composition enables highly reliable pattern formation. The finding has led to the completion of the present invention.

According to the present invention, there are provided a positive type photosensitive anionic electrocoating composition comprising as essential components:

(A) a resin containing, in the molecule, carboxyl groups and structural units represented by the following formula (I)

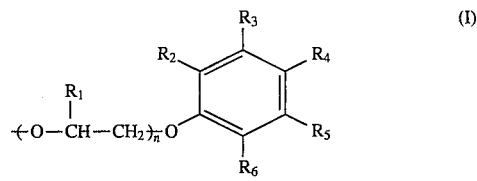

(wherein n is an integer of 1–9; $R_1$ is a hydrogen atom or a methyl group; and $R_2$, $R_3$, $R_4$, $R_5$ and $R_6$ are independently a hydrogen atom, a halogen atom, an alkyl group of 1–10 carbon atoms or a benzyl group), and (B) a compound containing at least one quinone diazide sulfone unit, and containing carboxyl groups in an amount of 0.2–3 moles per kg (solid content) of the composition; and a process for pattern formation using the above composition.

DETAILED DESCRIPTION OF THE INVENTION

The present invention is hereinafter described in more detail.

In the formula (I), "an alkyl group" represented by $R_2$, $R_3$, $R_4$, $R_5$ and/or $R_6$ may be any of straight chain type and branched chain type. Examples thereof are alkyl groups of 1–10 carbon atoms such as methyl, ethyl, n-propyl, isopropyl, n-butyl, isobutyl, sec-butyl, tert-butyl, n-pentyl, isopentyl, tert-pentyl, neopentyl, n-hexyl, isohexyl, 1-methylpentyl, 2-methylpentyl, n-heptyl, 5-methylhexyl, n-octyl, n-nonyl, n-decyl and the like.

In the formula (I), n (which represents a number of moles of ethylene oxide or propylene oxide added) desirably is generally 1–9, particularly 1–4. With respect to the substituents ($R_2$ to $R_6$) on the benzene ring, it is preferable that (1) $R_2$ to $R_6$ are each a hydrogen atom, (2) $R_4$ is an alkyl group of 1–10, particularly 9 carbon atoms and $R_2$, $R_3$, $R_5$ and $R_6$ are each a hydrogen atom, or (3) $R_2$, $R_4$ and $R_6$ are each a halogen atom (e.g. a bromine atom) and $R_3$ and $R_5$ are each a hydrogen atom.

In the positive type photosensitive electrocoating composition of the present invention, the resin (A) containing carboxyl groups and structural units represented by the formula (I) as the essential components, can be obtained, for example, by copolymerizing a polymerizable unsaturated monomer represented by the following formula (II), a polymerizable unsaturated monomer having carboxyl group(s), and other polymerizable unsaturated monomer.

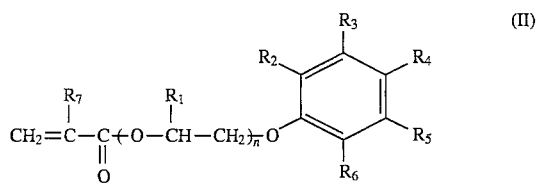
(II)

wherein $R_7$ is a hydrogen atom or a methyl group; and n, $R_1$, $R_2$, $R_3$, $R_4$, R5 and $R_6$ have the same definitions as given above.

As the polymerizable unsaturated monomer represented by the formula (II), there can be used a commercial monomer which is known per se. Examples thereof are ARONIX M-101 (n=2, $R_1$–$R_7$=H), ARONIX M-102 (n=4, $R_1$–$R_7$=H ), ARONIX M-111 (n=1, $R_1$–$R_3$=H, $R_4$=$C_9 H_{19}$ , $R_5$ –$R_7$=H), ARONIX M-113 (n=4, $R_1$–$R_3$=H, $R_4$=$C_9 H_{19}$, $R_5$– $R_7$=H) , ARONIX M-117 (a mixture of n=2 and n=3, $R_1$=$CH_3$, $R_2$–$R_3$=H, $R_4$=$C_9H_{19}$, $R_5$–$R_7$=H) (these are products of Toagosei Chemical Industry Co., Ltd.), and New Frontier BR-31 (n=1, $R_1$, $R_3$, $R_5$=H, $R_2$, $R_4$, $R_6$=Br, $R_7$=H) (a product of Dai-Ichi Kogyo Seiyaku Co., Ltd. ).

As the polymerizable unsaturated monomer having carboxyl group(s), there can be cited, for example, mono- or dicarboxylic acids of preferably 3–5 carbon atoms, having one polymerizable double bond, such as (meth)acrylic acid, crotonic acid, itaconic acid, maleic acid and the like. Of these, (meth) acrylic acid is particularly preferable.

The other polymerizable unsaturated monomer has no particular restriction as to its kind as long as it is copolymerizable with the monomer of formula (II) and the carboxyl group(s)-containing monomer. Examples thereof are $C_1$–$C_{18}$ alkyl esters of (meth)acrylic acid, such as methyl (meth)acrylate, ethyl (meth)acrylate, n-butyl (meth)acrylate, isobutyl (meth)acrylate, hexyl (meth)acrylate, 2-ethylhexyl (meth)acrylate, lauryl (meth)acrylate and the like; vinyl aromatic compounds such as styrene, a-methylstyrene, vinyltoluene and the like; $C_1$–$C_{12}$ hydroxyalkyl esters of (meth)acrylic acid, such as 2-hydroxyethyl (meth)acrylate, hydroxypropyl (meth)acrylate and the like; and hydroxyl group-containing unsaturated monomers such as allyl alcohol and the like. These monomers can be used singly or in combination of two or more. Of them, particularly preferable are methyl (meth)acrylate, ethyl (meth)acrylate, n-butyl (meth)acrylate, styrerie and 2-hydroxyethyl (meth)acrylate.

The resin (A) can be produced by a per se known method, for example, by copolymerizing the above-mentioned three kinds of monomers in an appropriate organic solvent in the presence of a radical initiator used in ordinary radical polymerization, such as azo compound (e.g. azobisisobutyronitrile), peroxide compound (e.g. benzoyl peroxide) or the like at a reaction temperature of about 30° to about 140° C., preferably about 60° to about 120° C. for about 1–20 hours, preferably about 3–8 hours.

The organic solvent usable in the above copolymerization is conveniently a water-soluble organic solvent ordinarily used in electrocoating. Examples thereof are methanol, ethanol, n-propanol, isopropanol, butanol, ethylene glycol, butyl cello solve, ethyl cellosolve, diethylene glycol, methylcarbitol, ethylene glycol dimethyl ether, diethylene glycol dimethyl ether and propylene glycol monomethyl ether.

The compounding proportions of the three kinds of monomers are not strictly restricted, but can generally be 5–93% by weight, preferably 20–70% by weight, more preferably 20–50% by weight [the polymerizable unsaturated monomer represented by the formula (II)], 2–60% by weight , preferably 3–40% by weight, more preferably 3–20% by weight [the polymerizable unsaturated monomer having carboxyl group(s)], and 5–90% by weight, preferably 10–70% by weight, more preferably 30–70% by weight (the other radical unsaturated monomer).

The resin (A) preferably has a number-average molecular weight of generally 5,000–100,000 , particularly 10,0 00–70,000. When the number-average molecular weight is smaller than 5,000, the photosensitive film formed by electrocoating is brittle, causing easy disconnection of pattern. When the number-average molecular weight is larger than 100,000, it is generally difficult to synthesize the resin (A) owing to its high viscosity.

The content of carboxyl groups in the resin (A) is preferably 0.3–3 moles, particularly 0.5–2.5 moles, more particularly 0.5–1.3 moles per kg of the resin. When the content of carboxyl groups is less than 0.3 mole/kg, the solubility of the irradiated portion of photosensitive film in alkali developer tends to be insufficient. When the content is more than 3 moles/kg, the resistance of the unirradiated portion of photosensitive film to alkali developer tends to be insufficient. In either case, therefore, it may be impossible to obtain an electrocoating composition capable of giving a high contrast.

The content of the structural units of formula (I) in the resin (A) is desirably 0.3–3 moles, particularly 0.5–2.5 moles, more particularly 0.5–2.0 moles per mole of the resin. When the content of the structural units of formula (I) is less than 0.3 moles/kg, the inemulsion stability of photosensitizer in composition tends to be low and the storage stability of electrocoating bath tends to be poor. When the content is more than 3 moles/kg, the contrast between the irradiated and removed (by development) portion and the unirradiated portion each of the electrocoating film ends to be low.

The resin (A) preferably has a glass transition temperature (Tg) of 0° C. or more, particularly 5°–70° C., more particularly 15–70° C. When Tg is lower than 0° C., the film formed is sticky and easily picks up dust, etc., making difficult the handling.

In the composition of the present invention, the compound (B) used in combination with the resin (A) is a photosensitive compound containing at least one, preferably one to four quinone diazide sulfone units. The quinone diazide sulfone units are represented, for example, by the following formulas (III) and (IV):

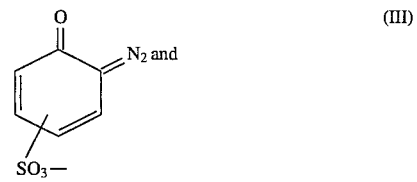
(III)

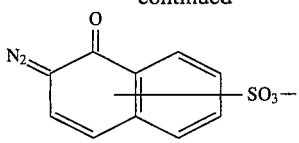

The photosensitive compound containing such unit(s) includes, for example, photosensitive compounds obtained by the reaction between a quinone diazide sulfonic acid halide and a hydroxyl group-containing compound.

The hydroxyl group-containing compound includes, for example, polyhydric phenols such as resorcinol, hydroquinone and the like; trihydroxybenzophenones such as 2,3,4-trihydroxybenzophenone, 2,4,4'-trihydroxybenzophenone and the like; tetrahydroxybenzophenones such as 2,3,4,4'-tetrahydroxybenzophenone, 2,2',4,4'-tetrahydroxybenzophenone and the like; and $C_1$–$C_4$ alkyl esters of gallic acid, such as methyl gallate, ethyl gallate and the like.

Of various photosensitive compounds, preferable are quinone diazide sulfonic acid esters of polyhydroxybenzophenones, obtained by reacting a polyhydroxybenzophenone (e.g. tri- or tetrahydroxybenzophenone) with 1,2-naphthoquinone diazide 5-sulfonic acid, 1,2-naphthoquinone diazide 4-sulfonic acid, a sulfonic acid chloride thereof, 1,2-quinone diazide sulfonic acid, a sulfonic acid chloride thereof, or the like, in view of the accuracy of pattern, etc.

Of these photosensitive compounds, particularly preferable are quinone diazide sulfonic acid esters represented by the following general formula (V), particularly the following formula (VI) or (VII).

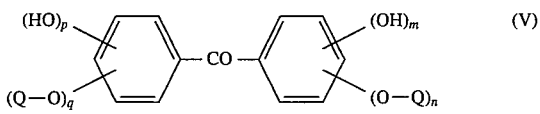

(wherein Q is a quinone diazide sulfone unit represented by the above formula (III) or (IV); m is 0, 1 or 2; n is 1, 2 or 3; m+n≦3; p is 0, 1 or 2; and q is 0, 1 or 2).

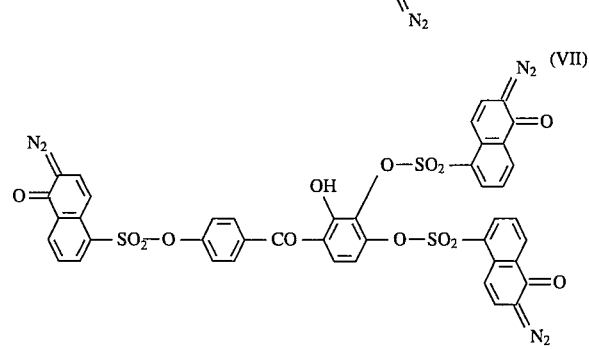

The preferable content of the photosensitive compound (B) in the composition is generally 2–30% by weight, particularly 5–20% by weight based on the solid content of the composition. When the content of the photosensitive compound (B) is less than 2% by weight, the amount of photosensitive groups is insufficient and the solubility of the irradiated portion of photosensitive film in developer is insufficient. When the content is more than 30% by weight, the storage stability of electrocoating bath is poor and the photosensitive compound causes deposition, which may invite inconveniences such as low photosensitivity and the like.

The photosensitive electrocoating composition of the present invention containing the resin (A) and the photosensitive compound (B) as the essential components, contains carboxyl groups in an amount of preferably 0.2–3 moles, particularly 0.5–2.5 moles, more particularly 0.5–1.5 moles per kg of the solid content of the composition. When the amount of carboxyl groups in composition is less than 0.2 mole/kg, it is generally difficult to make the composition water-soluble or water-dispersible by neutralization of carboxyl groups and accordingly it is difficult to obtain a stable electrocoating bath. When the amount of carboxyl groups is more than 3 moles/kg, the efficiency of electrocoating is low.

The resin (A) is therefore used in the present composition in such an amount that the carboxyl group amount in the composition is in the above-mentioned range. The content of the resin (A) in the composition can be generally 70–98% by weight, preferably 80–95% by weight based on the solid content of the composition.

The electrocoating composition of the present invention can be made water-soluble or water-dispersible by neutralizing the carboxyl groups in the composition with a basic compound. The basic compound has no particular restriction as to its kind and includes, for example, inorganic or organic bases such as trimethylamine, monoethanolamine, diethanolamine, diisopropylamine, dimethylaminoethanol, morpholine, ammonia, sodium hydroxide and the like. The neutralization is conducted generally in such an extent that 20–100% of the carboxyl groups present in the composition is neutralized.

As the practical method for dissolving or dispersing the present composition in an aqueous medium, there can be cited, for example, a method of adding the neutralization product of the composition to an aqueous medium to give rise to dissolution or dispersion; a method of adding an aqueous medium to the neutralization product to give rise to dissolution or dispersion; a method of adding the unneutralized composition to an aqueous medium containing a basic compound, to give rise to dissolution or dispersion; and a method of adding an aqueous medium containing basic compound, to the unneutralized composition give rise to dissolution or dispersion.

The thus-obtained aqueous electrocoating composition has excellent storage stability and circulation stability in a wide solid content range of 0.5–40% by weight.

The present composition can comprise, as necessary, a solvent in order to promote the dissolution of the resin and photosensitizer components or to control the thickness and flowability of the film formed by electrocoating. The solvent has no particular restriction as to its kind, but examples thereof are hydrophilic solvents such as alcohol (e.g. propanol or butanol), monoether between glycol (e.g. ethylene glycol, diethylene glycol, propylene glycol or dipropylene glycol) and alcohol (e.g. methanol, ethanol, propanol or butanol), diether between said glycol and said alcohol, methyl ethyl ketone, tetrahydrofuran, dioxane, dimethylformamide and the like; and hydrophobic solvents such as hexyl alcohol, octyl alcohol, monoether between said glycol and alcohol (e.g. hexanol, octanol or phenol), diether between said glycol and alcohol (e.g. hexanol, octanol or phenol), ketone (e.g. methyl isobutyl ketone, cyclohexanone or isophorone), aromatic hydrocarbon (e.g. toluene, xylene or ethyl benzene) and the like.

The hydrophilic solvent is particularly effective for dissolution of the resin and photosensitizer components and for flowability control, and is preferably used in an amount of generally 200 parts by weight or less per 100 parts by weight of the total of the resin (A) and the compound (B).

The electrocoating composition of the present invention can further comprise, as necessary, additives (e.g. surfactant, flowability-controlling agent and chelating agent), a pigment, a dye, etc.

The solid content of the present electrocoating composition is not particularly restricted but preferably is generally 3–40% by weight, particularly 5–20% by weight. There is generally used an electrocoating bath having a solid content of 3–20% by weight. In order to keep the electrocoating bath at a given concentration. It is necessary to use, for solid content make-up, an aqueous dispersion having a solid content of about 1.5–2 times that of the electrocoating bath. Hence, the aqueous dispersion must have good stability in the above solid content range in order to obtain excellent running stability.

The pattern formation using the photosensitive electrocoating composition of the present invention can be conducted, for example, as follows.

First, the present electrocoating composition is coated on a substrate having an electro-conductive film, or on a metal plate. This can be conducted, for example, by dipping, in an electrcoating bath comprising the present composition (solid content in bath=3–20% by weight), an electro-conductive material to be coated (this is used as an anode), such as a substrate having an electro-conductive film (e.g. a copper foil), an electro-conductive metal (e.g. copper or aluminum) or alloy plate, a metal plate plated with said metal or alloy, or the like, and then applying a direct current of constant voltage or constant current density to give rise to electrocoating. The application of direct current can also be conducted by a combination of said constant voltage method and said constant current method In the constant voltage method, the voltage can be generally 10–300 V; and in the constant current method, the current density can be generally 10–200 mA/dm$^2$. The time of current application is generally 20 seconds to 10 minutes, and the film thickness can be 1–50μ, preferably 2–20μ in terms of dry film thickness.

After the electrocoating, the coated material is pulled up from the electrocoating bath and then dried with hot air or the like, whereby a positive type photosensitive film can be formed on the substrate or metal plate.

Then, the positive type photosensitive film is subjected to direct drawing with a laser beam or is irradiated with an actinic radiation such as ultraviolet light or the like. In the present invention, the actinic radiation used for irradiation is preferably a light having a wavelength of 3,000–4,500 Å. The source for such a light includes sunlight, a mercury lamp, a xenon lamp, an arc lamp, etc. The irradiation with an actinic radiation is conducted generally at 30–800 mJ/cm$^2$, preferably at 50–500 mJ/cm$^2$. After the irradiation with an actinic radiation, the film can be heated as necessary at a temperature of 100° C. or more, preferably 100°–140° C. for 1–30 minutes to increase the insolubility of unirradiated film portion in developer and the resistance of said portion to etching.

The film after irradiation is treated with an alkaline developer to remove the irradiated film portion. The development treatment can be conducted generally by spraying a dilute aqueous alkali solution on the film to wash away the irradiated film portion. As the dilute aqueous alkali solution, there can be used an aqueous solution of pH 9–13, containing sodium hydroxide, potassium hydroxide, sodium metasilicate, sodium carbonate or the like.

The film after development is washed with water and dried with hot air or the like, whereby an intended pattern can be formed on the electro-conductive material.

The thus-formed pattern-shaped film can be used as an etching resist. For example, the exposed metal (e.g. copper) portion can be removed by an ordinary etching treatment using an aqueous ferric chloride solution, an aqueous cuptic chloride solution or the like and then the pattern-shaped resist film is removed with, for example, a strong alkali (e.g. sodium hydroxide), whereby an etched product or an electro-conductive pattern can be obtained.

As described above, the positive type photosensitive electrocoating composition of the present invention gives an electrocoating bath having excellent storage stability, excellent circulation stability and, even at low turnover speeds, high running stability, and therefore is highly productive and very economical. The film formed with the composition gives a high contrast between the irradiated and removed (by development) portion and the unirradiated portion, and the unirradiated film portion has high etching resistance. Therefore, the composition is expected to have wide applications in, for example, (1) use as a material for printing plate (wherein a precise image is required), an information recording material, a material for relief image, or the like, (2) production of printed wiring board (wherein a high-density and fine pattern is required), and (3) fine metal processing.

EXPERIMENT

The present invention is hereinafter described more specifically by way of Examples.

Production Example 1: Production of resin A-1

| | |
|---|---|
| n-Butyl methacrylate | 223 parts by weight |
| ARONIX M-117 | 241 parts by weight |
| 2-Hydroxyethyl acrylate | 207 parts by weight |
| Styrene | 200 parts by weight |
| Acrylic acid | 129 parts by weight |
| t-Butyl peroxy-2-ethylhexanoate | 10 parts by weight |

1,010 parts by weight of a mixture of the above materials was dropwise added, in 4 hours, to 502 parts by weight of propylene glycol monomethyl ether being stirred at 120° C. in a nitrogen stream in a reactor. The mixture was kept at the same temperature for 1 hour. Thereto was dropwise added, in 1 hour, 20 parts by weight of a solution obtained by dissolving 5 parts by weight of t-butyl peroxy-2-ethylhexanoate in 15 parts by weight of propylene glycol monomethyl ether. The mixture was kept at 120° C. for 1 hour and then cooled to obtain a resin solution A-1 having a solid content of about 66% by weight. The (solid content) had a number-average molecular weight (measured by gel permeation chromatography, the same applies hereinafter) of about 40,000 and a carboxyl group content of 1.79 moles/kg of resin.

Production Example 2: Production of resin A-2

| | |
|---|---|
| n-Butyl methacrylate | 223 parts by weight |
| ARONIX M-102 | 241 parts by weight |
| 2-Hydroxyethyl acrylate | 207 parts by weight |
| Styrene | 200 parts by weight |
| Acrylic acid | 129 parts by weight |
| t-Butyl peroxy-2-ethylhexanoate | 10 parts by weight |

1,010 parts by weight of a mixture of the above materials was dropwise added, in 4 hours, to 502 parts by weight of propylene glycol monomethyl ether being stirred at 120° C. in a nitrogen stream in a reactor. The mixture was kept at the same temperature for 1 hour. Thereto was dropwise added, in 1 hour, 20 parts by weight of a solution obtained by dissolving 5 parts by weight of t-butyl peroxy-2-ethylhexanoate in 15 parts by weight of propylene glycol monomethyl ether. The mixture was kept at 120° C. for 1 hour and then cooled to obtain a resin solution A-2 having a solid content of about 66% by weight, The resin (solid content) had a number-average molecular weight of about 40,000 and a carboxyl group content of 1,7 moles/kg of resin, Production Example 3: Production of resin A-3

| Methyl methacrylate | 289 parts by weight |
| ARONIX M-101 | 341 parts by weight |
| 2-Hydroxyethyl acrylate | 307 parts by weight |
| Acrylic acid | 63 parts by weight |
| t-Butyl peroxy-2-ethylhexanoate | 10 parts by weight |

1,010 parts by weight of a mixture of the above materials was dropwise added, in 4 hours, to 502 parts by weight of propylene glycol monomethyl ether being stirred at 120° C. in a nitrogen stream in a reactor. The mixture was kept at the same temperature for 1 hour. Thereto was dropwise added, in 1 hour, 20 parts by weight of a solution obtained by dissolving 5 parts by weight of t-butyl peroxy-2-ethylhexanoate in 15 parts by weight of propylene glycol monomethyl ether. The mixture was kept at 120° C. for 1 hour and then cooled to obtain a resin solution A-3 having a solid content of about 66% by weight. The resin (solid content) had a number-average molecular weight of about 40,000 and a carboxyl group content of 0.88 mole/kg of resin.

Production Example 4: Production of resin A-4

| Methyl methacrylate | 446 parts by weight |
| ARONIX M-102 | 341 parts by weight |
| Ethyl acrylate | 150 parts by weight |
| Acrylic acid | 63 parts by weight |
| t-Butyl peroxy-2-ethylhexanoate | 10 parts by weight |

1,010 parts by weight of a mixture of the above materials was dropwise added, in 4 hours, to 502 parts by weight of propylene glycol monomethyl ether being stirred at 120° C. in a nitrogen stream in a reactor. The mixture was kept at the same temperature for 1 hour. Thereto was dropwise added, in 1 hour, 20 parts by weight of a solution obtained by dissolving 5 parts by weight of t-butyl peroxy-2-ethylhexanoate in 15 parts by weight of propylene glycol monomethyl ether. The mixture was kept at 120° C. for 1 hour and then cooled to obtain a resin solution A-4 having a solid content of about 66% by weight. The resin (solid content) had a number-average molecular weight of about 40,000 and a carboxyl group content of 0.88 mole/kg of resin.

Production Example 5: Production of resin A-5

| Methyl methacrylate | 289 parts by weight |
| ARONIX M-101 | 341 parts by weight |
| 2-Hydroxyethyl acrylate | 307 parts by weight |
| Acrylic acid | 63 parts by weight |
| t-Butyl peroxy-2-ethylhexanoate | 20 parts by weight |

1,020 parts by weight of a mixture of the above materials was dropwise added, in 4 hours, to 502 parts by weight of propylene glycol monomethyl ether being stirred at 120° C. in a nitrogen stream in a reactor. The mixture was kept at the same temperature for 1 hour. Thereto was dropwise added, in 1 hour, 20 parts by weight of a solution obtained by dissolving 5 parts by weight of t-butyl peroxy-2-ethylhexanoate in 15 parts by weight of propylene glycol monomethyl ether. The mixture was kept at 120° C. for 1 hour and then cooled to obtain a resin solution A-5 having a solid content of about 66% by weight. The resin (solid content) had a number-average molecular weight of about 25,000 and a carboxyl group content of 0.88 mole/kg of resin.

Production Example 6: Production of resin A-6

| Methyl methacrylate | 446 parts by weight |
| ARONIX M-102 | 341 parts by weight |
| Ethyl acrylate | 150 parts by weight |
| Acrylic acid | 63 parts by weight |
| t-Butyl peroxy-2-ethylhexanoate | 50 parts by weight |

1,050 parts by weight of a mixture of the above materials was dropwise added, in 4 hours, to 502 parts by weight of propylene glycol monomethyl ether being stirred at 120° C. in a nitrogen stream in a reactor. The mixture was kept at the same temperature for 1 hour. Thereto was dropwise added, in 1 hour, 20 parts by weight of a solution obtained by dissolving 5 parts by weight of t-butyl peroxy-2-ethylhexanoate in 15 parts by weight of propylene glycol monomethyl ether. The mixture was kept at 120° C. for 1 hour and then cooled to obtain a resin solution A-6 having a solid content of about 66% by weight. The resin (solid content) had a number-average molecular weight of about 10,000 and a carboxyl group content of 0.88 mole/kg of resin.

Production Example 7: Production of resin A-7

| n-Butyl methacrylate | 223 parts by weight |
| n-Butyl acrylate | 241 parts by weight |
| 2-Hydroxyethyl acrylate | 207 part sby weight |
| Styrene | 200 parts by weight |
| Acrylic acid | 129 parts by weight |
| t-Butyl peroxy-2-ethylhexanoate | 10 parts by weight |

1,010 parts by weight of a mixture of the above materials was dropwise added, in 4 hours, to 502 parts by weight of propylene glycol monomethyl ether being stirred at 120° C. in a nitrogen stream in a reactor. The mixture was kept at the same temperature for 1 hour. Thereto was dropwise added, in 1 hour, 20 parts by weight of a solution obtained by dissolving 5 parts by weight of t-butyl peroxy-2-ethylhexanoate in 15 parts by weight of propylene glycol monomethyl ether. The mixture was kept at 120° C. for 1 hour and then cooled to obtain a resin solution A-7 having a solid content of about 66% by weight. The resin (solid content) had a number-average molecular weight of about 40,000 and carboxyl group content of 1.79 moles/kg of resin.

Example 8: Production of resin A-8

| | |
|---|---|
| n-Butyl methacrylate | 253 parts by weight |
| n-Butyl acrylate | 277 parts by weight |
| 2-Hydroxyethyl acrylate | 207 parts by weight |
| Styrene | 200 parts by weight |
| Acrylic acid | 63 parts by weight |
| t-Butyl peroxy-2-ethylhexanoate | 10 parts by weight |

1,010 parts by weight of a mixture of the above materials was dropwise added, in 4 hours, to 502 parts by weight of propylene glycol monomethyl ether being stirred at 120° C. in a nitrogen stream in a reactor. The mixture was kept at the same temperature for 1 hour. Thereto was dropwise added, in 1 hour, 20 parts by weight of a solution obtained by dissolving 5 parts by weight of t-butyl peroxy-2-ethylhexanoate in 15 parts by weight of propylene glycol monomethyl ether. The mixture was kept at 120° C. for 1 hour and then cooled to obtain a resin solution A-8 having a solid content of about 66% by weight. The resin (solid content) had a number-average molecular weight of about 40,000 and a carboxyl group content of 0.88 mole/kg of resin.

Example 1

There were mixed 152 parts by weight of the resin A-1 obtained as the component (A) in Production Example 1, 20 parts by weight of a photosensitizer NT- 200 as the component (B) [a product of Toyo Gosei Kogyo Co., Ltd., an ester of 1,2-naphthoquinone diazide 5-sulfonic acid chloride and 2,3,4-trihydroxybenzophenone (2.0/1.0 by molar ratio)] and 7.2 parts by weight of triethylamine as a neutralizing agent to obtain a uniform mixture. The mixture was slowly added to 930.8 parts by weight of deionized water with stirring at 1,000–3,000 rpm. After the addition, the mixture was stirred at 500 rpm for 20 minutes to obtain an aqueous dispersion I (solid content=10% by weight, carboxyl group content=1.63 moles/kg of solid content). The aqueous dispersion was subjected to a circulation stability test at a circulation rate of 0.5 l/min at 25° C. by the use of a chemical pump. The results is shown in Table 2. The aqueous dispersion I was also subjected to a storage stability test and showed stability and no deposition of photosensitizer at a wide temperature range of 5°–30° C. for 6 months.

Using each of the aqueous dispersions I right after preparation, after the above circulation stability test (240 hours of circulation) and after the above storage stability test, a resist film of 5–8 μm in thickness was formed on a copper-clad glass fiber-reinforced epoxy substrate used as an anode, by electrocoating in which a direct current was applied at a current density of 100 mA/dm² for 60 seconds. The resulting substrate was washed with water and dried at 80° C. for 10 minutes. Each of the thus-obtained resist films was irradiated at a dose of 200 mJ/cm² by the use of an ultrahigh-pressure mercury lamp and then dipped in a 1% aqueous sodium carbonate solution for development. In each sample, there was no change in electrocoating bath properties and resist film properties before and after test; the resolution was line/space=30/30 μm; the resistance to etchant (cuptic chloride) was sufficient; a good electro-conductive pattern could be obtained after etching; and the resist film could be removed within 240 seconds by spraying a 1 wt. % aqueous sodium hydroxide solution of 50° C.

Examples 2–6

Aqueous dispersions II to VI each having a solid content and carboxyl group content as shown in Table 1 were obtained according to the formulations shown in Table 1, in the same manner as in Example 1, and were subjected to the same circulation stability test as in Example 1. The results are shown in Table 2. The aqueous dispersions II to VI were also subjected to the same storage stability test as in Example 1, in which each sample showed stability and no deposition of photosensitizer at a wide temperature range of 5°–30° C. for 6 months.

Each of the aqueous dispersions II to VI right after preparation, after the above circulation stability test (240 hours of circulation) and after the above storage stability test was electrocoated on a copper-clad glass fiber-reinforced epoxy substrate in the same manner as in Example 1, followed by irradiation and development, to form resist films. In each sample, there was no change in electrocoating bath properties and resist film properties before and after test; the resolution was line/space=30/30 pro; the resistance to etchant (cuptic chloride) was sufficient; a good electro-conductive pattern could be obtained after etching; and the resist film could be removed within 240 seconds by spraying a 1 wt. % aqueous sodium hydroxide solution of 50° C.

Comparative Examples 1–2

Aqueous dispersions VII to VIII each having a solid content and carboxyl group content as shown in Table 1 were obtained according to the formulations shown in Table 1, in the same manner as in Example 1, and were subjected to the same circulation stability test as in Example 1. Each aqueous dispersion showed deposition of photosensitizer in 120 hours or more. The results are shown in Table 2.

TABLE 1

| Formulation | Examples | | | | | | Comparative Examples | |
|---|---|---|---|---|---|---|---|---|
| | 1 | 2 | 3 | 4 | 5 | 6 | 1 | 2 |
| Dispersion No. | I | II | III | IV | V | VI | VII | VIII |
| Resin (A) | A-1 | A-2 | A-3 | A-4 | A-5 | A-6 | A-7 | A-8 |
| Parts by weight | 152 | 152 | 152 | 152 | 152 | 152 | 152 | 152 |
| Photosensitive compound (B) | NT-200*¹ | NT-200 | NT-200 | NT-200 | NT-200 | NT-200 | NT-200 | NT-200 |
| Parts by weight | 10 | 10 | 20 | 20 | 20 | 20 | 10 | 10 |
| Neutralizing agent | Triethyl-amine | Triethyl-amine | Triethyl-amine | Triethyl-amine | Triethyl-amine | Triethyl-amine | Triethyl-amine | Triethyl-amine |
| Parts by weight | 7.2 | 7.2 | 5.4 | 5.4 | 5.4 | 5.4 | 7.2 | 5.4 |

TABLE 1-continued

| Formulation | Examples | | | | | | Comparative Examples | |
|---|---|---|---|---|---|---|---|---|
| | 1 | 2 | 3 | 4 | 5 | 6 | 1 | 2 |
| Deionized water Parts by weight | 930.8 | 930.8 | 1,022.6 | 1,022.6 | 1,022.6 | 1,022.6 | 930.8 | 932.6 |
| Solid content % by weight | 10 | 10 | 10 | 10 | 10 | 10 | 10 | 10 |
| Carboxyl group content (moles/Kg solid content) | 1.63 | 1.63 | 0.73 | 0.73 | 0.73 | 0.73 | 1.63 | 0.8 |

*[1]NT-200 is a photosensitizer produced by Toyo Gosei Kogyo Co., Ltd. and is an ester of 1,2-naphthoquinone diazide 5-sulfonic acid chloride and 2,3,4-trihydroxybenzophenone (2.0/1.0 molar ratio).

TABLE 2

| Circulation stability | Examples | | | | | | Comparative Examples | |
|---|---|---|---|---|---|---|---|---|
| test*[2] | 1 | 2 | 3 | 4 | 5 | 6 | 1 | 2 |
| Dispersion No. | I | II | III | IV | V | VI | VII | VIII |
| Circulation time 24 hours | o | o | o | o | o | o | X | o |
| Circulation time 120 hours | o | o | o | o | o | o | X | X |
| Circulation time 240 hours | o | o | o | o | o | o | X | X |

*[2]Evaluation standard
o: No deposition of photosensitizer is seen.
X: Deposition of photosensitizer is seen.

What is claimed is:

1. A positive photosensitive anionic electrocoating composition comprising an admixture of components:

(A) a resin containing, in the molecule, carboxyl groups and structural units represented by the following formula (I)

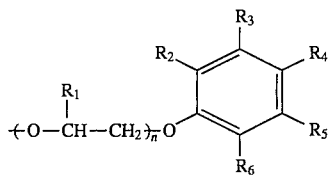

wherein n is an integer of 1–9; $R_1$ is a hydrogen atom or a methyl group; and $R_2$, $R_3$, $R_4$, $R_5$ and $R_6$ are independently a hydrogen atom, a halogen atom, an alkyl group of 1–10 carbon atoms or a benzyl group, and (B) a compound containing at least one quinone diazide sulfonyloxy unit, and containing carboxyl groups in an amount of 0.2–3 moles per kg (solid content) of the composition.

2. A composition set forth in claim 1, wherein in formula (I), n is 1–9; and $R_2$ to $R_6$ are each a hydrogen atom, or $R_4$ is an alkyl group of 1–10 carbon atoms and $R_2$, $R_3$, $R_5$ and $R_6$ are each a hydrogen atom, or $R_2$, $R_4$ and $R_6$ are each a halogen atom and $R_3$ and $R_5$ are each a hydrogen atom.

3. A composition set forth in claim 1, wherein the resin (A) has a number-average molecular weight of 5,000–100,000.

4. A composition set forth in claim 1, wherein the resin (A) contains carboxyl groups in an amount of 0.3–3 per kg of the resin.

5. A composition set forth in claim 1, wherein the resin (A) contains carboxyl groups in an amount of 0.5–2.5 moles per kg of the resin.

6. A composition set forth in claim 1, wherein the resin (A) contains structural units of formula (I) in an amount of 0.3–3 moles per kg of the resin.

7. A composition set forth in claim 1, wherein the resin (A) contains structural units of formula (I) in an amount of 0.5–2.5 moles per kg of the resin.

8. A composition set forth in claim 1, wherein the resin (A) has a glass transition temperature of 0° C. or more.

9. A composition set forth in claim 1, wherein the resin (A) has a glass transition temperature of 5°–70° C.

10. A composition set forth in claim 1, wherein the resin (A) is obtained by copolymerization of a polymerizable unsaturated monomer represented by the following formula (II)

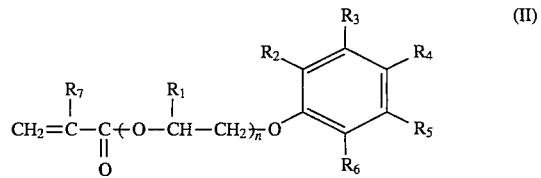

wherein $R_7$ is a hydrogen atom or a methyl group; n, $R_1$, $R_2$, $R_3$, $R_4$, $R_5$ and $R_6$ have the same definitions as given in claim 1, a polymerizable unsaturated monomer having carboxyl group(s) and other polymerizable unsaturated monomer.

11. A composition set forth in claim 10, wherein the polymerizable unsaturated monomer of formula (II) is a compound of formula (II) wherein n=2 and $R_1$–$R_7$=H; n=4 and $R_1$–$R_7$=H; n=1, $R_1$–$R_3$=H, $R_4$=$C_9H_{19}$ and $R_5$–$R_7$=H; n=4, $R_1$–$R_3$=H, $R_4$=$C_9H_{19}$ and $R_5$–$R_7$=H; a mixture of n=2 and n=3, $R_1$=$CH_3$, $R_2$–$R_3$=H, $R_4$=$C_9H_{19}$ and $R_5$–$R_7$=H; or n=1, $R_1$, $R_3$ and $R_5$=H, $R_2$, $R_4$ and $R_6$=Br and $R_7$=H.

12. A composition set forth in claim 10, wherein the polymerizable unsaturated monomer having carboxyl group(s) is an aliphatic mono- or dicarboxylic acid of 3–5 carbon atoms, having one polymerizable double bond.

13. A composition set forth in claim 12, wherein the polymerizable unsaturated monomer having carboxyl group(s) is selected from the group consisting of (meth)acrylic acid, crotonic acid, itaconic acid and maleic acid.

14. A composition set forth in claim 10, wherein the other polymerizable unsaturated monomer is selected from the group consisting of methyl (meth)acrylate, ethyl (meth)acrylate, n-butyl (meth)acrylate, styrene and 2-hydroxyethyl (meth)acrylate.

15. A composition set forth in claim 10, wherein the resin (A) is obtained by copolymerizing 5–93% by weight of the polymerizable unsaturated monomer of formula (II), 2–60% by weight of the polymerizable monomer having carboxyl group(s) and 5–90% by weight of the other polymerizable monomer.

16. A composition set forth in claim 1, wherein the compound (B) contains one to four quinone diazide sulfonyloxy units.

17. A composition set forth in claim 1, wherein the compound (B) contains at least one quinone diazide sulfonyloxy unit represented by the following formula (III) or (IV):

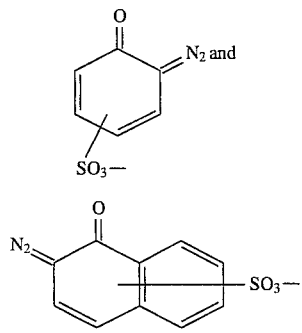

18. A composition set forth in claim 1, wherein the compound (B) is an quinone diazide sulfonic acid ester of a polyhydroxybenzophenone.

19. A composition set forth in claim 17, wherein the compound (B) is a compound represented by the following formula (V)

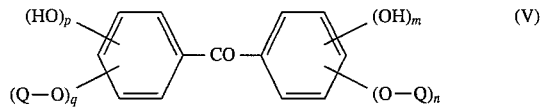

wherein Q is a quinone diazide sulfonyloxy unit represented by the formula (III) or (IV) set forth in claim 17; m is 0, 1 or 2; n is 1, 2 or 3; m+n≦3; p is 0, 1 or 2; and q is 0, 1 or 2.

20. A composition set forth in claim 19, wherein the compound (B) is a compound represented by the following formula (VI) or (VII):

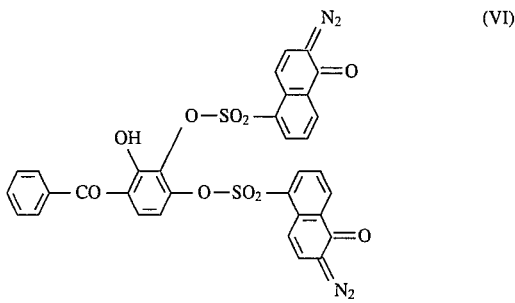

or

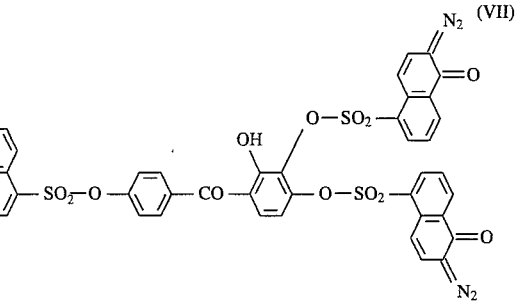

21. A composition set forth in claim 1, wherein the content of the compound (B) is 2–30% by weight based on the solid content of the composition.

22. A composition set forth in claim 1, wherein the content of the compound (B) is 5–20% by weight based on the solid content of the composition.

23. A composition set forth in claim 1, wherein the content of the carboxyl groups is 0.5–2.5 moles per kg (solid content) of the composition.

24. A composition set forth in claim 1, wherein the content of the resin (A) is 70–98% by weight based on the solid content of the composition.

25. A composition set forth in claim 1, which is neutralized with a basic compound.

26. An electrocoating bath comprising an aqueous solution or aqueous dispersion of a composition of claim 25.

* * * * *